United States Patent
Kim et al.

(10) Patent No.: US 11,239,166 B2
(45) Date of Patent: Feb. 1, 2022

(54) THREE-DIMENSIONAL SEMICONDUCTOR MEMORY DEVICE

(71) Applicant: SK hynix Inc., Icheon-si (KR)

(72) Inventors: Jeong Hwan Kim, Hwaseong-si (KR); Jin Ho Kim, Hwaseongsi (KP); Byung Hyun Jun, Icheon-si (KR); Chang Woon Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/876,008

(22) Filed: May 16, 2020

(65) Prior Publication Data

US 2021/0183770 A1 Jun. 17, 2021

(30) Foreign Application Priority Data

Dec. 16, 2019 (KR) .......................... 10-2019-0167561

(51) Int. Cl.

| | |
|---|---|
| *H01L 23/535* | (2006.01) |
| *H01L 27/11524* | (2017.01) |
| *H01L 27/11556* | (2017.01) |
| *H01L 27/11529* | (2017.01) |
| *H01L 23/528* | (2006.01) |

(Continued)

(52) U.S. Cl.
CPC ........ *H01L 23/535* (2013.01); *H01L 23/5226* (2013.01); *H01L 23/5283* (2013.01); *H01L 27/1157* (2013.01); *H01L 27/11524* (2013.01); *H01L 27/11529* (2013.01);
(Continued)

(58) Field of Classification Search
CPC . H01L 23/535; H01L 23/481; H01L 23/5283; H01L 23/5226; H01L 27/11524; H01L 27/11556; H01L 27/11529; H01L 27/11582; H01L 27/11573; H01L 27/1157; H01L 27/11565; H01L 27/11575; H01L 27/11526; G11C 5/025
See application file for complete search history.

(56) References Cited

U.S. PATENT DOCUMENTS

| | | | |
|---|---|---|---|
| 10,141,326 B1 * | 11/2018 | Oh ........................ | H01L 23/528 |
| 2016/0064281 A1 * | 3/2016 | Izumi .................. | H01L 23/5226 257/315 |

(Continued)

FOREIGN PATENT DOCUMENTS

| | | |
|---|---|---|
| KR | 10-2017-0124378 A | 11/2017 |
| WO | 2017/122302 A1 | 7/2017 |

*Primary Examiner* — Galina G Yushina

(57) ABSTRACT

A semiconductor memory device includes a cell region defined with vertical channels which pass through electrode layers and interlayer dielectric layers alternately stacked; a step region disposed adjacent to the cell region in a first direction, and defined with contacts coupled to the electrode layers extending in different lengths; a first opening passing through the electrode layers and the interlayer dielectric layers in the step region; a second opening passing through the electrode layers and the interlayer dielectric layers in the cell region; under wiring lines coupled with a peripheral circuit defined on a substrate; top wiring lines disposed over the electrode layers and the interlayer dielectric layers, and coupled with the contacts; and vertical vias coupling the under and top wiring lines, wherein the vertical vias include first vertical vias which pass through the first opening and second vertical vias which pass through the second opening.

20 Claims, 13 Drawing Sheets

(51) Int. Cl.
*H01L 27/11582* (2017.01)
*H01L 27/11573* (2017.01)
*H01L 23/522* (2006.01)
*H01L 27/1157* (2017.01)

(52) U.S. Cl.
CPC .. *H01L 27/11556* (2013.01); *H01L 27/11573* (2013.01); *H01L 27/11582* (2013.01)

(56) References Cited

U.S. PATENT DOCUMENTS

| | | | |
|---|---|---|---|
| 2016/0163732 A1* | 6/2016 | Lim | H01L 27/11582 |
| | | | 257/314 |
| 2018/0233185 A1* | 8/2018 | Futats | G11C 8/14 |
| 2019/0237472 A1* | 8/2019 | Oh | G11C 16/24 |
| 2020/0295032 A1* | 9/2020 | Tobioka | H01L 21/0337 |
| 2021/0028111 A1* | 1/2021 | Kai | H01L 27/11582 |

* cited by examiner

THREE-DIMENSIONAL SEMICONDUCTOR MEMORY DEVICE

CROSS-REFERENCE TO RELATED APPLICATION

The present application claims priority under 35 U.S.C. § 119(a) to Korean Patent Application No. 10-2019-0167561 filed in the Korean Intellectual Property Office on Dec. 16, 2019, which is incorporated herein by reference in its entirety.

BACKGROUND

1. Technical Field

Various embodiments generally relate to a semiconductor memory device, and particularly, to a three-dimensional semiconductor memory device.

2. Related Art

In order to meet demands for excellent performance and low price that consumers demand, the degree of integration in a semiconductor device must increase. Since the degree of integration of a two-dimensional or planar semiconductor memory device is mainly determined by the area occupied by a unit memory cell, the degree of integration is greatly influenced by the level of a fine pattern forming technique. However, since highly expensive equipment is required for the formation of a fine pattern, the degree of integration of a two-dimensional semiconductor memory device is still limited, although it is increasing. To overcome such limitations, alternatives include a three-dimensional semiconductor memory device including memory cells that are three-dimensionally arranged has been proposed.

In a three-dimensional semiconductor memory device, the degree of integration may be increased by increasing the stack number of row lines. However, since the number of wiring lines coupled to the row lines increases in proportion to the number of row lines, a large number of metal layers are required.

SUMMARY

Various embodiments are directed to a semiconductor memory device capable of contributing to a reduction in the number of metal layers.

In an embodiment, a semiconductor memory device may include: a cell region defined with a plurality of vertical channels which pass through a plurality of electrode layers and a plurality of interlayer dielectric layers alternately stacked on a source plate; a step region disposed adjacent to the cell region in a first direction parallel to a top surface of the source plate, and defined with a plurality of contacts which are coupled to the plurality of electrode layers extending in different lengths; a first opening passing through the plurality of electrode layers and the plurality of interlayer dielectric layers, in a vertical direction in the step region; a second opening passing through the plurality of electrode layers and the plurality of interlayer dielectric layers, in the vertical direction in the cell region; a plurality of under wiring lines disposed under the source plate, and coupled with a peripheral circuit which is defined on a substrate below the source plate; a plurality of top wiring lines disposed over the plurality of electrode layers and the plurality of interlayer dielectric layers, and coupled with the plurality of contacts; and a plurality of vertical vias coupling the plurality of under wiring lines and the plurality of top wiring lines. The vertical vias may include a plurality of first vertical vias which pass through the first opening and a plurality of second vertical vias which pass through the second opening.

In an embodiment, a semiconductor memory device may include: a cell region having a plurality of vertical channels which pass through a plurality of electrode layers and a plurality of interlayer dielectric layers alternately stacked on a source plate; a step region adjacent to the cell region in a first direction that is parallel to a top surface of the source plate, and having a plurality of contacts which are coupled to the plurality of electrode layers extending in different lengths into the step region; a first opening passing through the plurality of electrode layers and the plurality of interlayer dielectric layers, in a vertical direction in the step region; a second opening and a third opening passing through the plurality of electrode layers and the plurality of interlayer dielectric layers, in the vertical direction in the cell region, and arranged in the first direction; a plurality of under wiring lines disposed under the source plate, and coupled with a peripheral circuit which is defined on a substrate below the source plate; a plurality of top wiring lines disposed over the plurality of electrode layers and the plurality of interlayer dielectric layers, and coupled with the plurality of contacts; and a plurality of vertical vias coupling the plurality of under wiring lines and the plurality of top wiring lines. The plurality of vertical vias may include a plurality of first vertical vias which pass through the first opening, a plurality of second vertical vias which pass through the second opening, and a plurality of third vertical vias which pass through the third opening.

In an embodiment, a semiconductor memory device may include: a plurality of pass transistors defined in a substrate which is defined with a cell region, a step region extending in a first direction from the cell region and a peripheral region extending in the first direction from the step region; a plurality of electrode layers and a plurality of interlayer dielectric layers alternately stacked on a source plate over the plurality of pass transistors; vertical channels passing through the plurality of electrode layers and the plurality of interlayer dielectric layers, in the cell region; a plurality of under wiring lines disposed between the plurality of pass transistors and the source plate, and coupled to the plurality of pass transistors; a plurality of top wiring lines disposed over the electrode layers and the plurality of interlayer dielectric layers, and coupled to the plurality of electrodes layers through plurality of contacts which are coupled to the plurality of electrode layers, respectively, in the step region; and a plurality of vertical vias coupling the plurality of top wiring lines and the plurality of under wiring lines. The plurality of vertical vias may include first vertical vias that pass through a first opening defined in the electrode layers and the interlayer dielectric layers in the step region, and second vertical vias that pass through a second opening defined in the plurality of electrode layers and the plurality of interlayer dielectric layers in the cell region.

DETAILED DESCRIPTION

Figure 1:
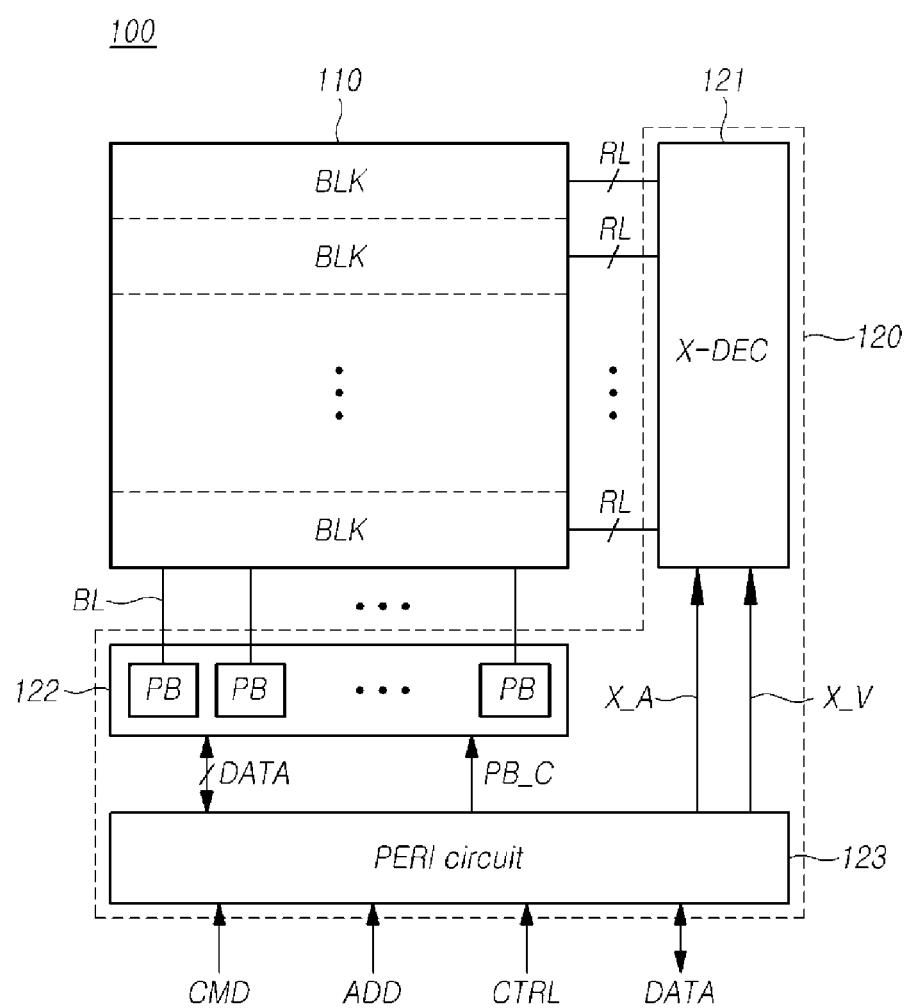
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. In the following disclosure, embodiments may be described as applied to NAND flash memory, but it is to be noted that the disclosure is not limited thereto.

The memory cell array 110 may be coupled to the row decoder 121 through a plurality of row lines RL. The row lines RL may include at least one drain select line, a plurality of word lines and at least one source select line. The memory cell array 110 may be coupled to the page buffer circuit 122 through a plurality of bit lines BL.

The row decoder 121 may select any one among the memory blocks BLK included in the memory cell array 110 in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110. In order to transfer the operating voltage X_V to the row lines RL, the row decoder 121 may include a plurality of pass transistors, which are coupled to the row lines RL of the memory blocks BLK. The number of the pass transistors included in the row decoder 121 may be proportional to the number of the memory blocks BLK and the number of the row lines RL included in each memory block BLK.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells which are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, such as for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Hereinbelow, in the accompanying drawings, two directions that are parallel to the top surface of a substrate or a source plate and intersect with each other are defined as a first direction FD and a second direction SD, respectively, and a direction that vertically projects from the top surface of the substrate or the source plate is defined as a third direction TD. For example, the first direction FD may correspond to the extending direction of word lines and the arrangement direction of bit lines, and the second direction SD may correspond to the extending direction of the bit lines and the arrangement direction of the word lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
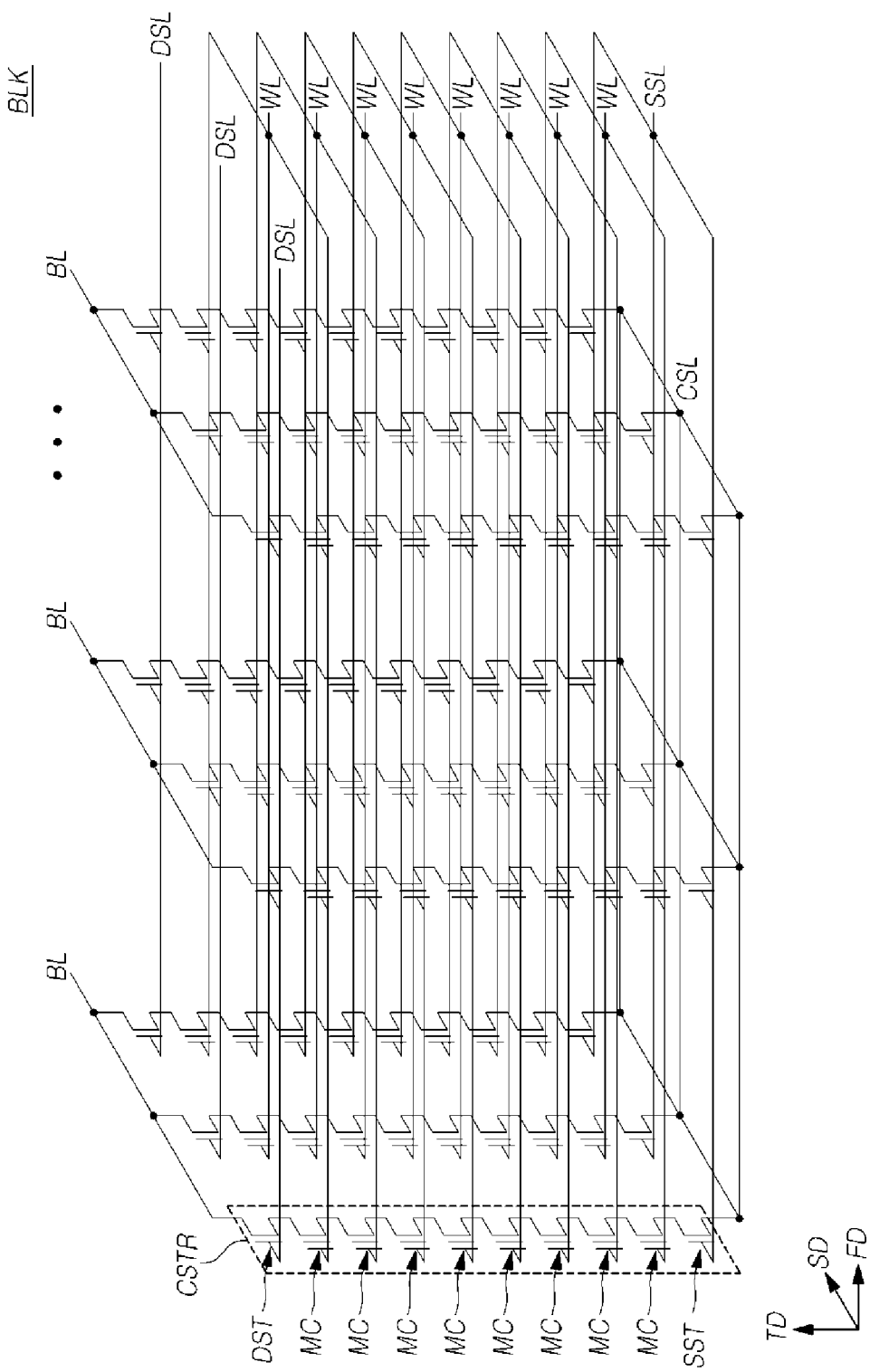
FIG. 2 is an equivalent circuit diagram illustrating an example of one of memory blocks illustrated in FIG. 1.

FIG. 2 is an equivalent circuit diagram illustrating an example of one of the memory blocks BLK illustrated in FIG. 1.

Referring to FIG. 2, the memory block BLK may include a plurality of cell strings CSTR, which are coupled between a plurality of bit lines BL and a common source line CSL. The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be stacked between the bit lines BL and the common source line CSL in the third direction TD. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page.

Figure 3:
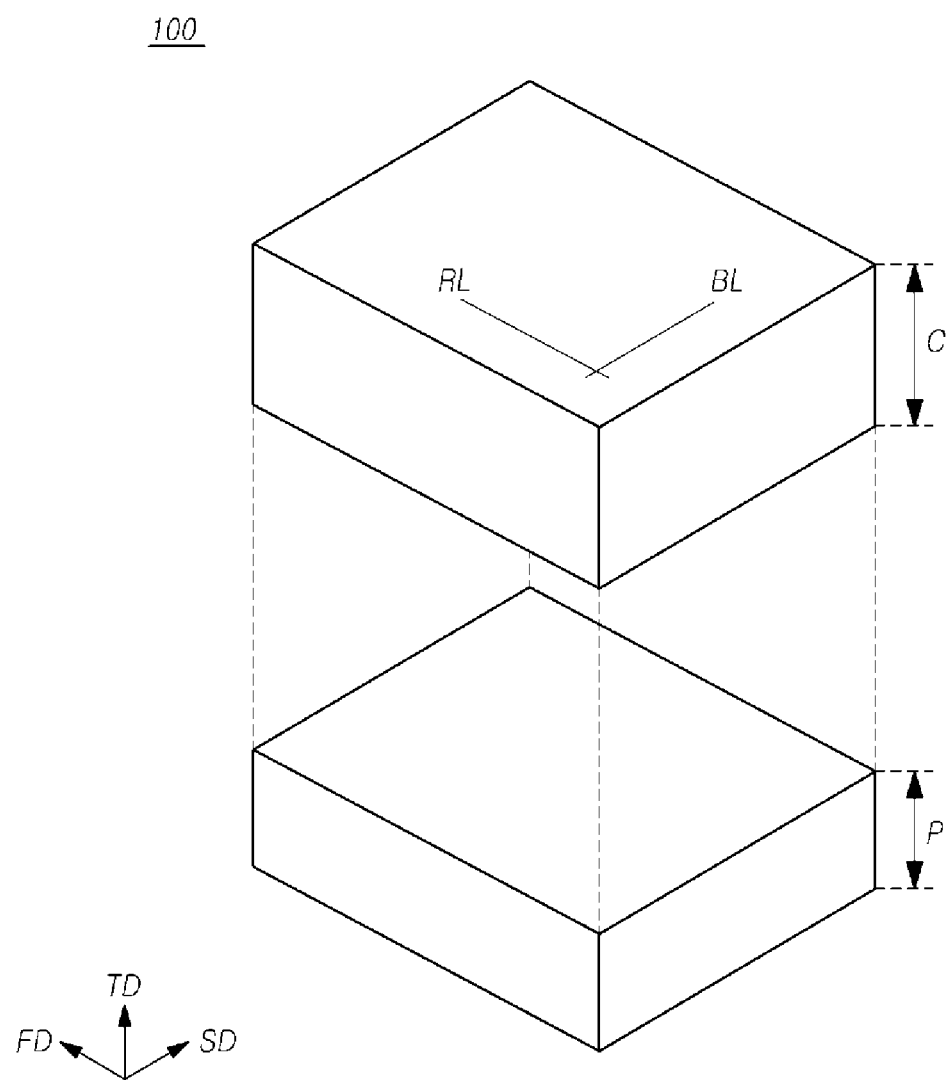
FIG. 3 is a perspective view schematically illustrating a semiconductor memory device in accordance with an embodiment of the disclosure.
Figure 4A:
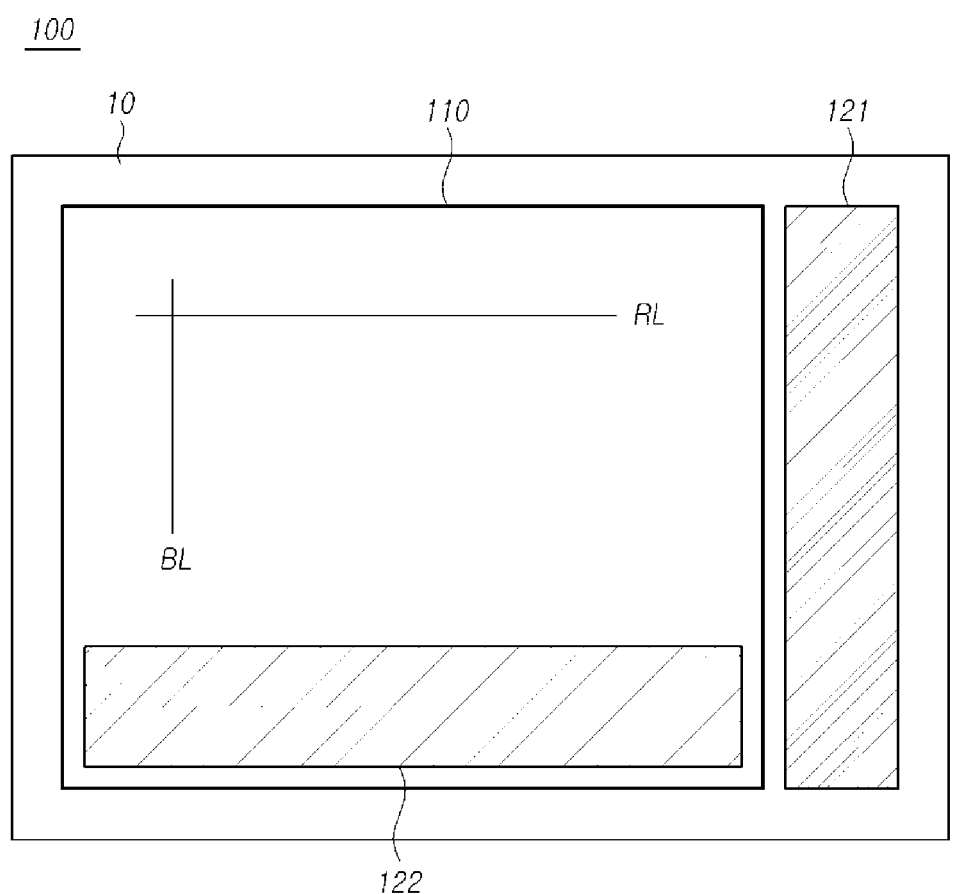
FIG. 4A is a top view schematically illustrating a semiconductor memory device related to the disclosure.
Figure 4B:
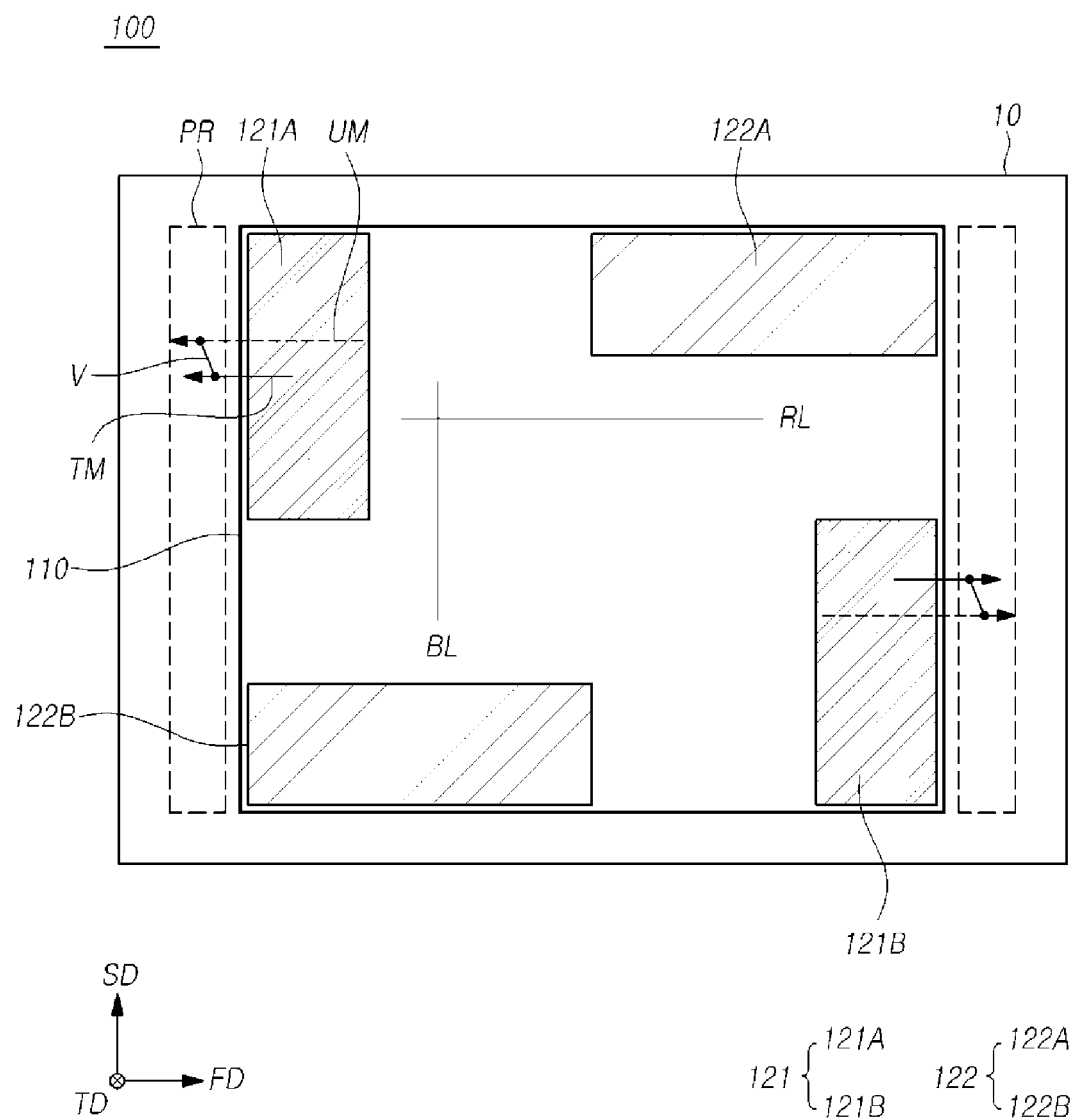
FIG. 4B is a top view schematically illustrating a semiconductor memory device related to the disclosure.

FIG. 3 is a perspective view schematically illustrating a semiconductor memory device in accordance with an embodiment of the disclosure. FIG. 4A is a top view schematically illustrating a semiconductor memory device related to the disclosure. FIG. 4B is a top view schematically illustrating a semiconductor memory device related to the disclosure.

Referring to FIG. 3, a semiconductor memory device 100 in accordance with an embodiment of the disclosure may have a PUC (peri under cell) structure. A logic structure P including a row decoder (121 of FIG. 1), a page buffer circuit (122 of FIG. 1) and a peripheral circuit (123 of FIG. 1) may be disposed under a memory structure C, which includes a memory cell array (110 of FIG. 1).

By disposing circuits (except the memory cell array 110) under the memory cell array 110, the PUC structure may effectively reduce a layout area, and accordingly, it is possible to increase the number of semiconductor memory devices 100 manufactured from a single wafer.

Referring to FIG. 4A, as the degree of integration and operation speed of a semiconductor memory device 100 increase, it is required to reduce the delay of signals provided to row lines RL from a row decoder 121. To this end, circuits configuring the row decoder 121 may be disposed adjacent to and along one edge of the memory cell array 110 in the second direction SD being a direction in which the row lines RL are arranged. Consequently, the row decoder 121 may have a shape which extends in the second direction SD and may have a length substantially the same as or similar to the length of the memory cell array 110 in the second direction SD.

Also, as the degree of integration and operation speed of the semiconductor memory device 100 increases, it is required to reduce the delay of signals applied to bit lines BL from a page buffer circuit 122, or signals received from the page buffer circuit 122 from the bit lines BL. To this end, circuits configuring the page buffer circuit 122 may be disposed adjacent to and along another edge of the memory cell array 110 in the first direction FD being a direction in which the bit lines BL are arranged. Due to this fact, the page buffer circuit 122 may have a shape which extends in the first direction FD and may have a length substantially the same as or similar to the length of the memory cell array 110 in the first direction FD.

Since the row decoder 121 and the page buffer circuit 122 have the same or similar lengths as or to the memory cell array 110 in specific directions, in order for making both the row decoder 121 and the page buffer 122 to overlap with the memory cell array 110 in the third direction TD, a portion of the row decoder 121 and a portion of the page buffer 122 should be overlapped each other. However, in a structure in which the row decoder 121 and the page buffer circuit 122 are disposed on the same plane, it is impossible for the row decoder 121 and the page buffer circuit 122 to overlap each other. Therefore, it may be difficult for both the row decoder 121 and the page buffer 122 to overlap with the memory cell array in the third direction TD. For these reasons, the page buffer circuit 122 may be disposed to overlap with the memory cell array 110, and the row decoder 121 may be disposed on a substrate 10 without overlapping with the memory cell array 110.

Meanwhile, if the stack number of the row lines RL is increased to support a larger capacity and higher degree of integration of the semiconductor memory device 100, the number of pass transistors included in the row decoder 121 needs to be increased. But to maintain the length of the row decoder 121 in the second direction SD as substantially the same as or similar to the length of the memory cell array 110, an increased number of pass transistors needs to be disposed in the first direction FD. Therefore, as the length of the row decoder 121 in the first direction FD increases, the length of the semiconductor memory device 100 in the first direction FD may also increase and may cause the device to be larger than a predetermined packaging size.

Referring to FIG. 4B, each of a row decoder 121 and a page buffer circuit 122 may be separated into two or more parts, and the separated parts of the row decoder 121 and the page buffer circuit 122 may be disposed around the periphery of the memory cell array 110. For example, circuits included in the row decoder 121 may be separated into first and second row decoders 121A and 121B, and circuits included in the page buffer circuit 122 may be separated into first and second page buffer circuits 122A and 122B. The first and second row decoders 121A and 121B may be disposed to overlap opposite corners of the memory cell array 110. Similarly, the first and second page buffer circuits 122A and 122B may be disposed to overlap the remaining opposite corners of the memory cell array 110. The first and second row decoders 121A and 121B and the first and second page buffer circuits 122A and 122B may be disposed to overlap with the memory cell array 110 in the third direction TD. Because the page buffer circuit 122 and the row decoder 121 overlap with the memory cell array 110, it is possible to reduce the size of a semiconductor memory device 100 in FIG. 4B. However, because the memory cell array 110 is disposed over the row decoder 121, wiring paths for coupling pass transistors of the row decoder 121 with the row lines RL of the memory cell array 110 should be configured to bypass the memory cell array 110.

FIG. 4B illustrates a method for configuring bypass wiring paths in which top wiring lines TM coupled to the row lines RL of the memory cell array 110, and under wiring lines UM coupled to the pass transistors of the row decoder 121, are extended to peripheral regions PR outside the memory cell array 110 and are coupled with each other using vertical vias V in the peripheral regions PR. In this case, the numbers of the top wiring lines TM and the under wiring lines UM in the peripheral regions PR may increase, thereby increasing the number of required metal layers. Accordingly, the number of manufacturing steps required for forming the metal layers may increase, thereby increasing manufacturing time and manufacturing cost, and increasing the probability of a failure occurring during the manufacturing process.

If the number of memory blocks is reduced, then the number of the row lines RL and the number of the pass transistors is also reduced, and the number of wiring lines that couple the row lines RL and the pass transistors may be reduced, and an increase in the number of the metal layers is not necessary. However, if the number of memory blocks is reduced while maintaining the capacity of the semiconductor memory device 100 as it is, then the number of cell strings included in each memory block increases, and in this case, the parasitic capacitance between the cell strings and the row lines RL increases, thereby degrading the operation characteristics of the semiconductor memory device.

Embodiments of the disclosure may provide a semiconductor memory device capable of reducing the number of metal layers without detriment to or degradation of the operation characteristics of the semiconductor memory device.

Figure 5:
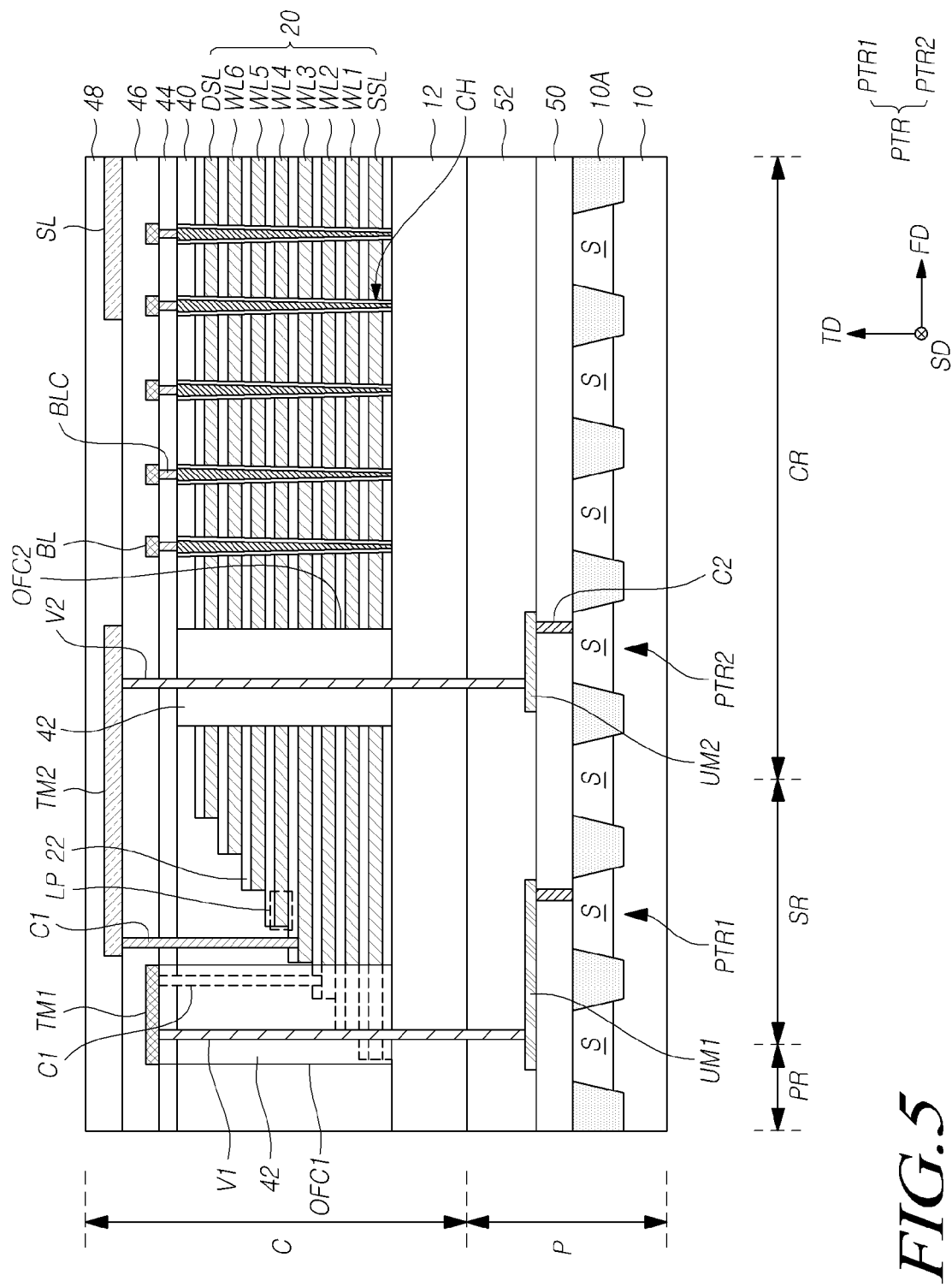
FIG. 5 is a cross-sectional view illustrating a representation of a semiconductor memory device in accordance with an embodiment of the disclosure.
Figure 6:
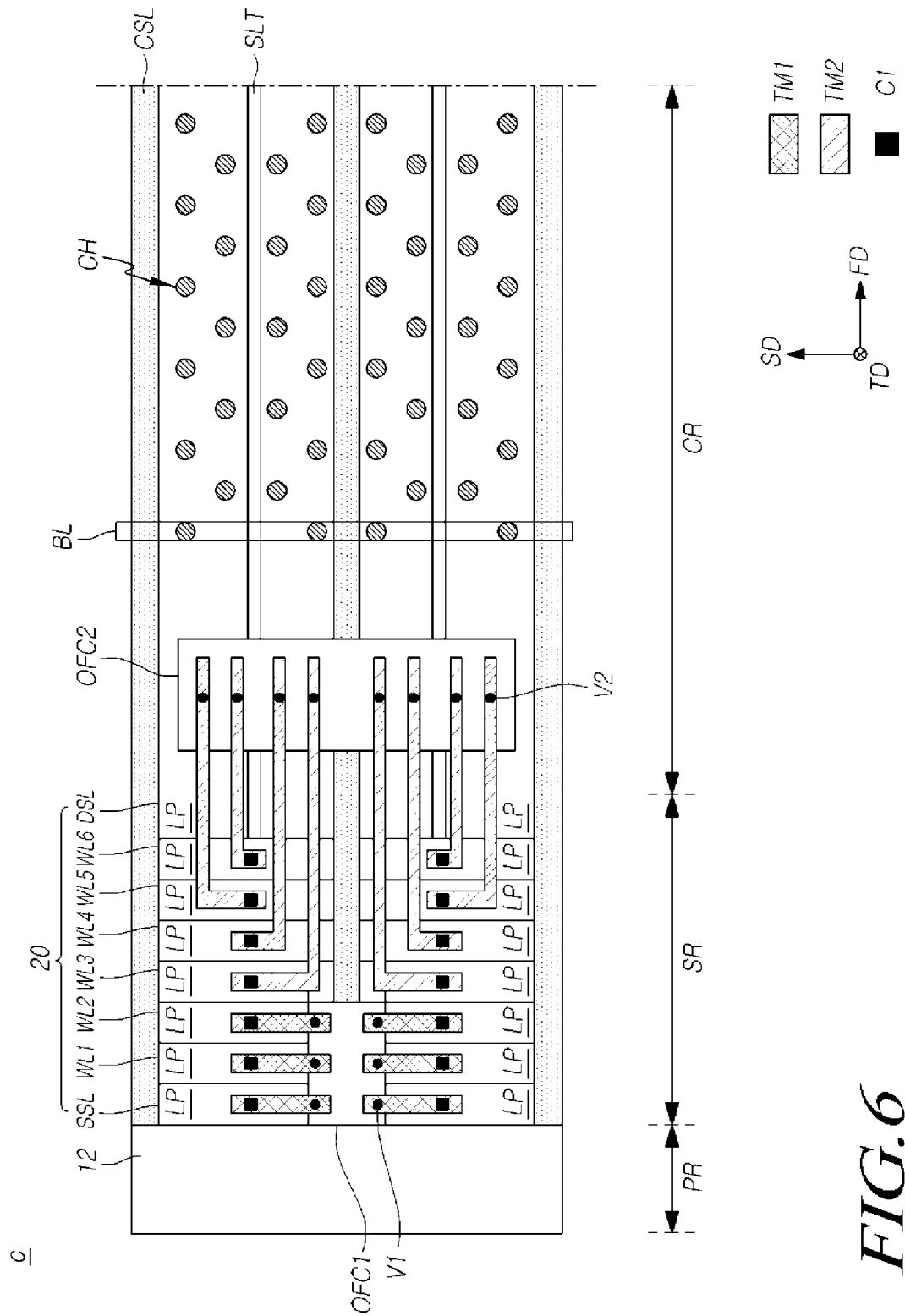
FIG. 6 is a top view illustrating an example of a memory structure of FIG. 5.
Figure 7:
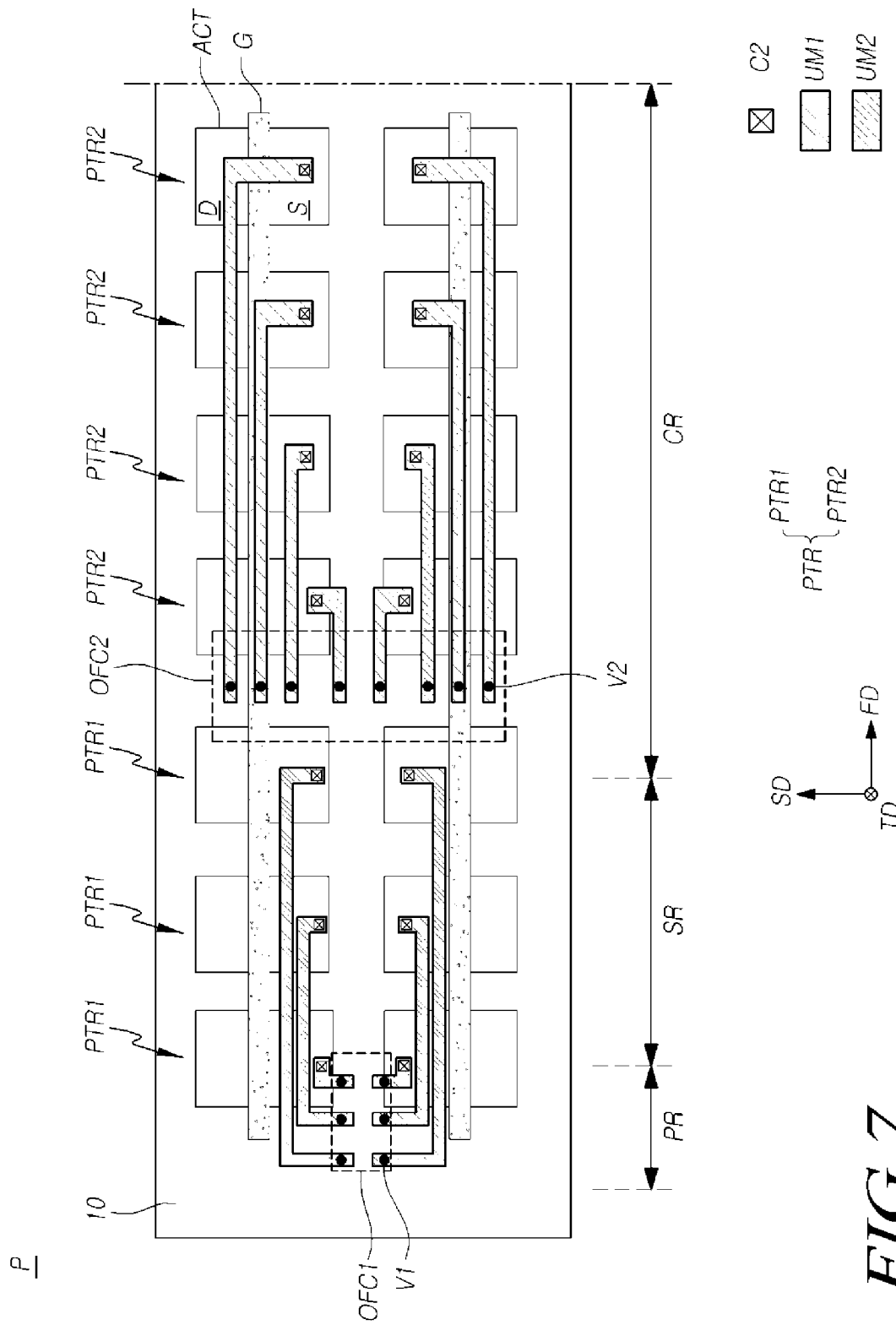
FIG. 7 is a top view illustrating an example of a logic structure of FIG. 5.

FIG. 5 is a cross-sectional view illustrating a representation of a semiconductor memory device in accordance with an embodiment of the disclosure. FIG. 6 is a top view illustrating an example of a memory structure of FIG. 5. FIG. 7 is a top view illustrating an example of a logic structure of FIG. 5. FIG. 5 is a view for facilitating the understanding of the disclosure and does not represent a cross-sectional view that is cut in any specific direction.

Referring to FIGS. 5 and 6, a semiconductor memory device 100 may include a cell region CR, a step region SR which extends in the first direction FD from the cell region CR, and a peripheral region PR which extends in the first direction FD from the step region SR. The cell region CR, the step region SR and the peripheral region PR may be sequentially disposed in the first direction FD.

A memory structure C may include a source plate 12, and a plurality of electrode layers 20 and a plurality of interlayer dielectric layers 22 that are alternately stacked on the source plate 12. The electrode layers 20 may include a conductive material. For example, the electrode layers 20 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 22 may include silicon oxide. Each electrode layer 20 may include at least one source select line SSL, a plurality of word lines WL1 to WL6 and at least one drain select line DSL. The electrode layers 20 may, as an example, configure row lines RL of FIG. 1.

The electrode layers 20 may extend from the cell region CR into the step region SR in different lengths, thereby forming a step structure in the step region SR. In the step region SR, each of the electrode layers 20 may have a pad region LP that is exposed by another electrode layer 20 positioned thereon.

A plurality of common source lines CSL which divide the electrode layers 20 and the interlayer dielectric layers 22 into a plurality of blocks or/and a plurality of fingers may be defined. The common source lines CSL may extend in the first direction FD, and may be disposed in the second direction SD. The common source lines CSL may be coupled to the source plate 12 by passing through the electrode layers 20 and the interlayer dielectric layers 22, which are alternately stacked, in the third direction TD. Sidewall dielectric layers (not illustrated) may be defined on both sidewalls of each common source line CSL in the second direction SD to isolate the common source line CSL and the electrode layers 20. Slits SLT may be defined in the drain select line DSL. The slits SLT may extend in the first direction FD, and may divide the drain select line DSL into units smaller than the blocks or/and the fingers.

A plurality of vertical channels CH may be defined in the cell region CR. The vertical channels CH may pass through the electrode layers 20 and the interlayer dielectric layers 22 in the third direction TD. The vertical channels CH may pass through all of the source select line SSL, the plurality of word lines WL1 to WL6 and the drain select line DSL. Although not numbered, each of the vertical channels CH may include a channel layer and a gate dielectric layer. The channel layer may include polysilicon or monocrystalline silicon, and may include a P-type impurity such as boron (B) in some regions. The gate dielectric layer may have the shape of a straw or a cylindrical shell which surrounds the outer wall of the channel layer. The gate dielectric layer may include a tunnel dielectric layer, a charge storage layer and a blocking layer which are sequentially stacked inwardly from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured where the source select line SSL surrounds the vertical channels CH. Memory cells may be configured where the word lines WL1 to WL6 surround the vertical channels CH. Drain select transistors may be configured where the drain select line DSL surrounds the vertical channels CH.

A dielectric layer 40 may be defined on the source plate 12 to cover the top surfaces and side surfaces of the electrode layers 20 and the interlayer dielectric layers 22, which are alternately stacked, and to cover the side surfaces of the vertical channels CH. In the step region SR, a first opening OFC1 may be defined in the dielectric layer 40, and the electrode layers 20 and the interlayer dielectric layers 22, which are alternately stacked. In the cell region CR, a second opening OFC2 may be defined in the dielectric layer 40, and the electrode layers 20 and the interlayer dielectric layers 22, which are alternately stacked. The first and second openings OFC1 and OFC2 may pass through the dielectric layer 40 and the electrode layers 20 and the interlayer dielectric layers 22. In an embodiment, the first opening OFC1 may pass through the source select line SSL and the word lines WL1 and WL2. The second opening OFC2 may pass through all of the source select line SSL, the plurality of word lines WL1 to WL6 and the drain select line DSL. While FIGS. 5 and 6 illustrate first opening OFC1 passing through the source select line SSL and the word lines WL1 and WL2, it is to be noted that the first opening OFC1 may also pass through at least one of the source select line SSL, the plurality of word lines WL1 to WL6 and the drain select line DSL depending on the extension of the word lines WL1 to WL6 into step region SR. The first and second openings OFC1 and OFC2 may be filled with a dielectric layer 42.

A dielectric layer 44 may be defined on the dielectric layers 40 and 42 to cover the top surfaces of the vertical channels CH. In the cell region CR, a plurality of bit lines BL may be disposed on the dielectric layer 44. The bit lines BL may extend in the second direction SD, and may be disposed or arranged in the first direction FD. While only one bit line BL is illustrated in FIG. 6 for the sake of simplicity in illustration, it is to be understood that a plurality of bit lines BL are repeatedly disposed or arranged in the first direction FD. The bit lines BL may be coupled to the vertical channels CH through bit line contacts BLC.

A dielectric layer 46 may be defined on the dielectric layer 44 to cover the bit lines BL. Source lines SL may be disposed on the dielectric layer 46. The source lines SL may be coupled to the common source lines CSL through contacts (not illustrated). A dielectric layer 48 may be defined on the dielectric layer 46 to cover the source lines SL.

In the step region SR, first contacts C1 may be disposed on the pad regions LP of the electrode layers 20, respectively. The first contacts C1 may be coupled to the pad regions LP of the electrode layers 20 in the step region SR, and may project in the third direction TD from the pad regions LP.

A plurality of top wiring lines TM1 and TM2 may be disposed on the dielectric layers 44 and 46. One end of each of the top wiring lines TM1 and TM2 may be coupled to a first contact C1 in the step region SR. The other ends of some of the top wiring lines TM1 and TM2 may extend to the top of the first opening OFC1 in the step region SR, and the other ends of the others of the top wiring lines TM1 and TM2 may extend to the top of the second opening OFC2 in the cell region CR. The top wiring lines TM1 and TM2 may include first top wiring lines TM1, which extend to the top of the first opening OFC1, and second top wiring lines TM2, which extend to the top of the second opening OFC2. The first top wiring lines TM1 may be disposed in or substantially in the step region SR. The second top wiring lines TM2 may be disposed in the step region SR and extend into the cell region CR.

First contacts C1, which are coupled to the first top wiring lines TM1, may be disposed closer to the peripheral region PR than first contacts C1, which are coupled to the second top wiring lines TM2. First contacts C1, which are coupled to the second top wiring lines TM2, may be disposed closer to the cell region CR than the first contacts C1, which are coupled to the first top wiring lines TM1. The first top wiring lines TM1 may be disposed closer to the peripheral region PR than the second top wiring lines TM2. An area in which the first top wiring lines TM1 are distributed and an area in which the second top wiring lines TM2 are distributed may be dispersed along the first direction FD. Therefore, it is possible to prevent the first and the second top wiring lines TM1 and TM2 from being disposed at a high density in a specific area, and bottleneck of the top wiring lines TM1 and TM2 can be prevented, suppressed or minimized.

The first top wiring lines TM1 may be disposed in the same layer as the bit lines BL. In this case, the first top wiring lines TM1 may be formed in the same process step as the bit lines BL, and may be made of the same material as the bit lines BL.

The second top wiring lines TM2 may be disposed in a layer higher in the third direction TD than the bit lines BL. For instance, the second top wiring lines TM2 may be disposed in the same layer as the source lines SL. In this case, the second top wiring lines TM2 may be formed in the same process step as the source lines SL, and may be made of the same material as the source lines SL. Although the above describes the first top wiring lines TM1 and the second top wiring lines TM2 as disposed in different layers, it is to be noted that the first top wiring lines TM1 and the second top wiring lines TM2 may be disposed in the same layer.

Vertical vias V1 and V2, which are coupled to the other ends opposite to the one ends of the first and second top wiring lines TM1 and TM2, respectively, may through the first and second openings OFC1 and OFC2 in the third direction TD. The vertical vias V1 and V2 may include first vertical vias V1, which are coupled to the first top wiring lines TM1, and second vertical vias V2, which are coupled to the second top wiring lines TM2.

Over the first opening OFC1, top ends of the first vertical vias V1 may be coupled to the first top wiring lines TM1, respectively. Under the first opening OFC1, bottom ends of the first vertical vias V1 may be coupled to the logic structure P. Over the second opening OFC2, top ends of the second vertical vias V2 may be coupled to the second top wiring lines TM2, respectively. Under the second opening OFC2, bottom ends of the second vertical vias V2 may be coupled to the logic structure P.

Referring to FIGS. 5 and 7, the logic structure P may include a substrate 10 and a plurality of pass transistors PTR, which are disposed on the substrate 10. FIGS. 5 and 7 illustrate pass transistors PTR disposed in the step region SR and at an edge of the cell region CR that is adjacent to the step region SR. Although not illustrated here, in other embodiments, the pass transistors PTR may be disposed only in the cell region CR without being disposed in the step region SR.

Active regions ACT, which are defined by an isolation layer 10A may be defined in the substrate 10. Each of the pass transistors PTR may include a gate G, and a source region S and a drain region D at opposite sides of the gate G in each active region ACT. A dielectric layer 50 may be defined on the substrate 10 to cover the pass transistors PTR. Second contacts C2 may be defined on the source regions S of the pass transistors PTR. The second contacts C2 may be coupled to the source regions S of the pass transistors PTR, respectively, through the dielectric layer 50.

Under wiring lines UM1 and UM2 may be disposed on the dielectric layer 50. A dielectric layer 52, which covers the under wiring lines UM1 and UM2, may be defined on the dielectric layer 50. The source plate 12 may be disposed on the dielectric layer 52.

Referring again to FIG. 7, one ends of the under wiring lines UM1 and UM2 may be coupled to the second contacts C2, respectively. The other ends of the under wiring lines UM1 may extend to the bottom of the first opening OFC1, and the other ends of the under wiring lines UM2 may extend to the bottom of the second opening OFC2. The vertical vias V1 and V2 may be coupled to the other ends of the under wiring lines UM1 and UM2, respectively. The under wiring lines UM1 and UM2 may include first under wiring lines UM1, which are coupled to the first vertical vias V1 and second under wiring lines UM2, which are coupled to the second vertical vias V2.

The under wiring lines UM1 and UM2 may be formed to have properties that do not exhibit a process failure, for example, a hillock, at a maximum temperature (hereinafter, referred to as a 'process critical temperature') in a process for forming the memory structure C. In other words, the under wiring lines UM1 and UM2 may be formed of a material which has a melting point higher than the process critical temperature and therefore to have a heat-resistant characteristic at the process critical temperature. For example, a material which forms the under wiring lines UM1 and UM2 may include tungsten (W). On the other hand, a conductive material used to form the top wiring lines TM1 and TM2 may include a material which has a resistivity lower than that of a conductive material which forms the under wiring lines UM1 and UM2. For example, a material used to form the top wiring lines TM1 and TM2 may be a material such as copper or aluminum, which has a low resistivity although it may cause a process failure at a temperature lower than the process critical temperature. Because the top wiring lines TM1 and TM2 are formed at a later stage or step for manufacturing the memory structure C, a material which has a low melting point and a low resistivity may be used as a conductive material which forms the top wiring lines TM1 and TM2. Due to the above-described limitation in the manufacturing process, the resistivity of the under wiring lines UM1 and UM2 may have a value relatively larger than that of the resistivity of the top wiring lines TM1 and TM2.

The pass transistors PTR may include first pass transistors PTR1 which are coupled to the first under wiring lines UM1 and second pass transistors PTR2 which are coupled to the second under wiring lines UM2. The first pass transistors PTR1 may be disposed closer to the peripheral region PR than the second pass transistors PTR2 in the first direction.

The first under wiring lines UM1 may be disposed closer to the peripheral region PR than the second under wiring lines UM2 in the first direction. An area in which the first under wiring lines UM1 are disposed and an area in which the second under wiring lines UM2 are disposed may be dispersed along the first direction FD. Therefore, it is possible to prevent the first and the second under wiring lines UM1 and UM2 from being disposed at a high density in a specific area, and bottleneck of the under wiring lines UM1 and UM2 can be prevented, suppressed or minimized.

According to the present embodiment, since bottleneck of the top wiring lines TM1 and TM2, and bottleneck of the under wiring lines UM1 and UM2 can be prevented, suppressed or minimized, the numbers of top wiring lines that can be disposed in a single metal layer may be increased and the numbers of under wiring lines that can be disposed in a single metal layer may be increased. Accordingly, the number of metal layers required for the disposition of the top wiring lines and the under wiring lines can be reduced.

Figure 8:
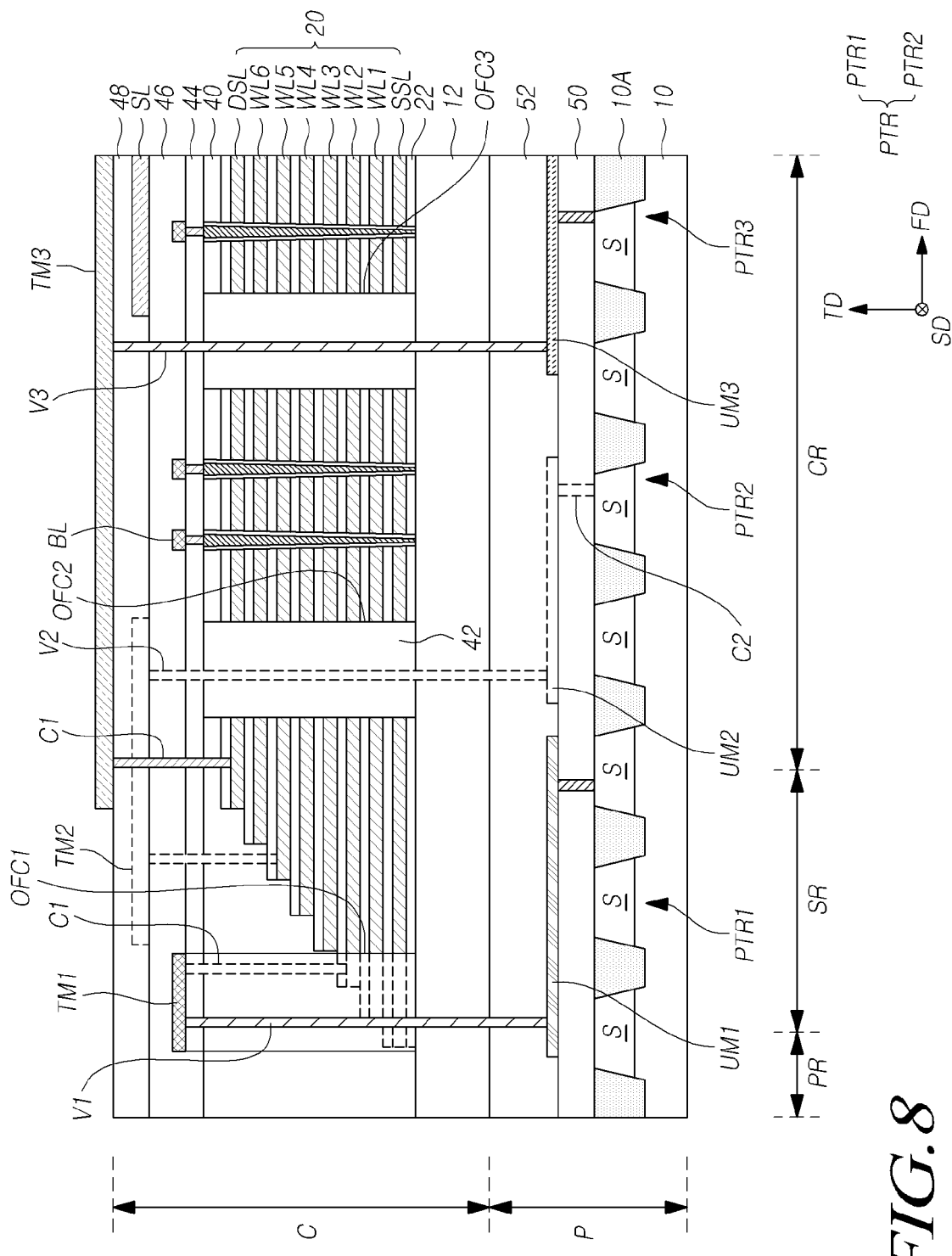
FIG. 8 is a cross-sectional view illustrating a representation of a semiconductor memory device in accordance with an embodiment of the disclosure.
Figure 9:
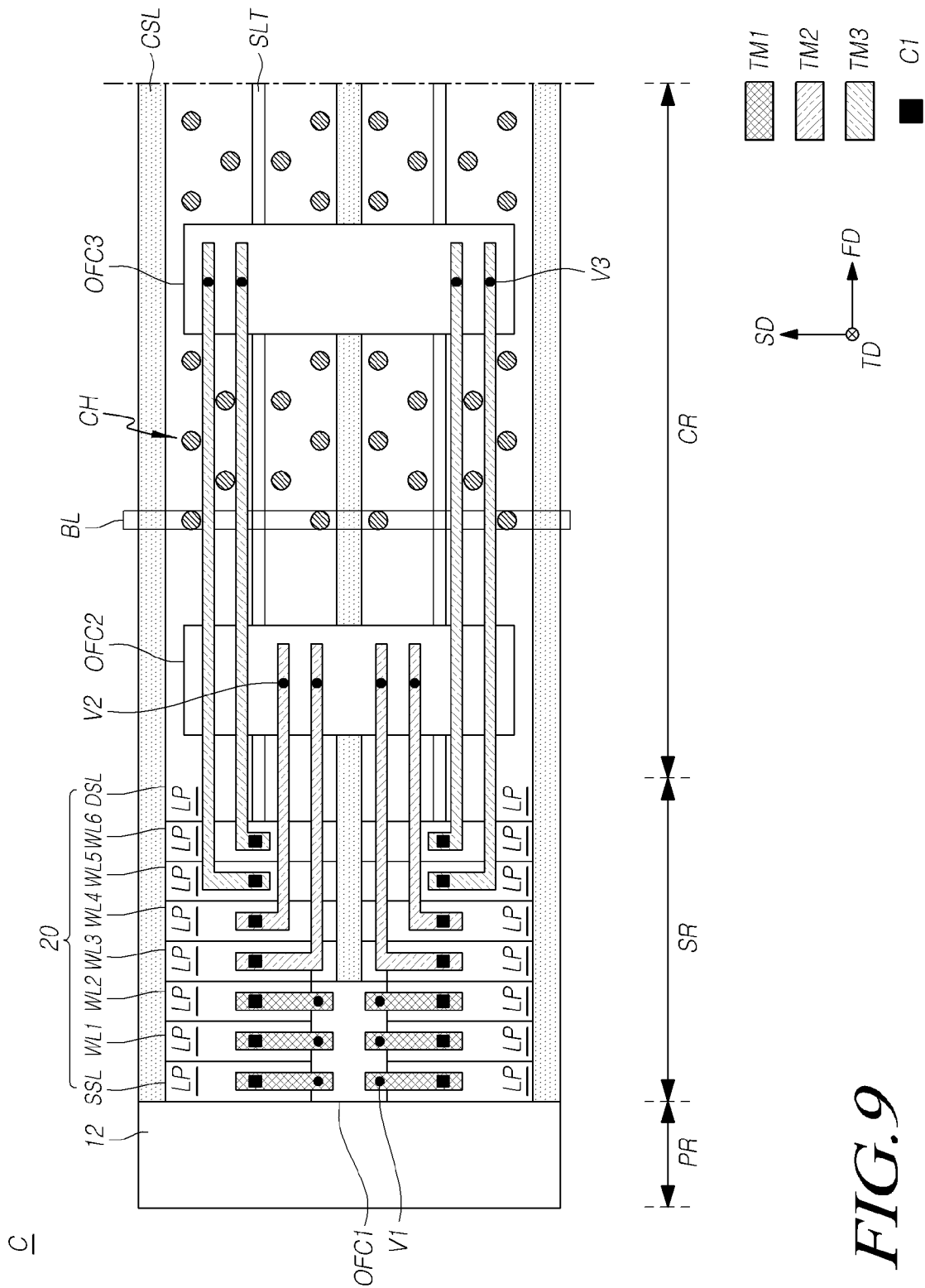
FIG. 9 is a top view illustrating an example of a memory structure of FIG. 8.
Figure 10:
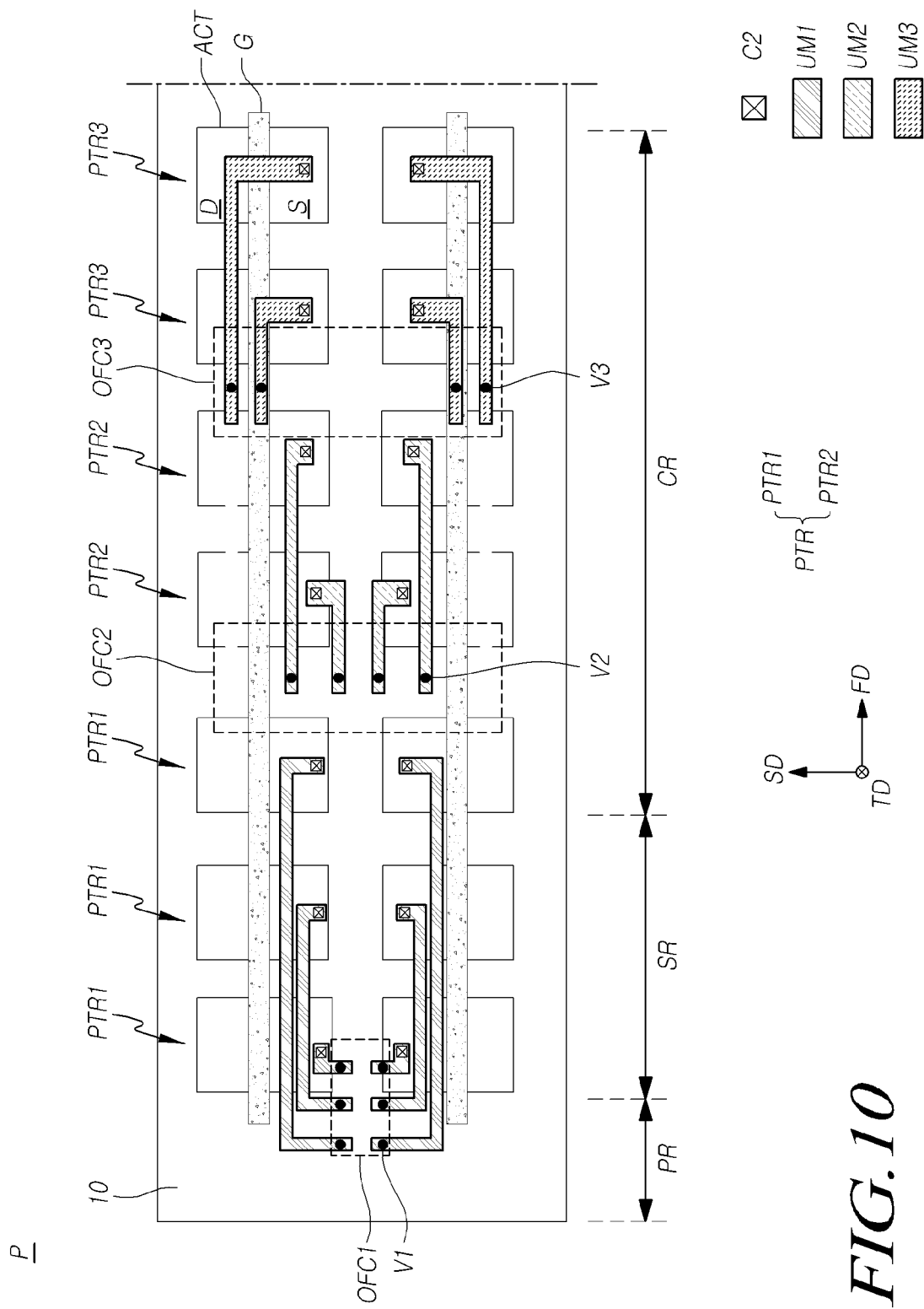
FIG. 10 is a top view illustrating an example of a logic structure of FIG. 8.

FIG. 8 is a cross-sectional view illustrating a representation of a semiconductor memory device in accordance with an embodiment of the disclosure. FIG. 9 is a top view illustrating an example of a memory structure of FIG. 8. FIG. 10 is a top view illustrating an example of a logic structure of FIG. 8. FIG. 8 is a view for facilitating the understanding of the disclosure and does not represent a cross-sectional view that is cut in any specific direction.

Referring to FIGS. 8 to 10, a first opening OFC1 may be disposed in the step region SR, and a second opening OFC2 and a third opening OFC3 may be disposed in the cell region CR, spaced apart in the first direction FD. While FIGS. 8 to 10 illustrate two openings in the cell region CR, it is to be noted that the number of openings disposed in the cell region CR is not limited thereto. A plurality of openings may be defined in the cell region CR in the first direction FD.

The first to third openings OFC1 to OFC3 may pass through the dielectric layer 40, and the electrode layers 20 and the interlayer dielectric layers 22, which are alternately stacked. The first to third openings OFC1 to OFC3 may be filled with the dielectric layer 42. The first opening OFC1 may pass through the source select line SSL and the word lines WL1 and WL2. The second opening OFC2 and the third opening OFC3 may pass through all of the source select line SSL, the plurality of word lines WL1 to WL6 and the drain select line DSL. While FIGS. 8 and 9 illustrate the first opening OFC1 passing through the source select line SSL and the word lines WL1 and WL2, it is to be noted that the first opening OFC1 may also pass through at least one of the source select line SSL, the plurality of word lines WL1 to WL6 and the drain select line DSL depending on the extension of the word lines WL1 to WL6 into step region SR.

One ends of the top wiring lines TM1, TM2 and TM3 may be coupled to the first contact C1, respectively, in the step region SR. The other end of some of the top wiring lines TM1, TM2 and TM3 may extend to the top of the first opening OFC1 of the step region SR, the other end of some of the top wiring lines TM1, TM2 and TM3 may extend to the top of the second opening OFC2 of the cell region CR, and the other end of the others of the top wiring lines TM1, TM2 and TM3 may extend to the top of the third opening OFC3 of the cell region CR. The top wiring lines TM1, TM2 and TM3 may include first top wiring lines TM1 which extend to the top of the first opening OFC1, second top wiring lines TM2 which extend to the top of the second opening OFC2, and third top wiring lines TM3 which extend to the top of the third opening OFC3.

First contacts C1 that are coupled to the first top wiring lines TM1 may be disposed closer to the peripheral region PR in the first direction than first contacts C1 that are coupled to the second top wiring lines TM2. The first contacts C1 that are coupled to the second top wiring lines TM2 may be disposed closer to the peripheral region PR in the first direction than first contacts C1 that are coupled to the third top wiring lines TM3.

The first top wiring lines TM1 may be disposed in the step region SR. One end of the second and third top wiring lines TM2 and TM3 may be disposed in the step region SR, and the other end may be disposed in the cell region CR. The first top wiring lines TM1 may be disposed closer to the peripheral region PR in the first direction than the second top wiring lines TM2. The second top wiring lines TM2 may be disposed closer to the peripheral region PR in the first direction than the third top wiring lines TM3. An area in which the first top wiring lines TM1 are distributed, an area in which the second top wiring lines TM2 are distributed, and an area in which the third top wiring lines TM3 are distributed may be dispersed along the first direction FD. Therefore, it is possible to prevent the first to the third top wiring lines TM1 to TM3 from being disposed at a high density in a specific area, and bottleneck of the top wiring lines TM1 to TM3 can be prevented, suppressed or minimized.

The first top wiring lines TM1 may be disposed in the same layer as the bit lines BL. The second top wiring lines TM2 may be disposed in a layer higher than the bit lines BL in the third direction TD. For instance, the second top wiring lines TM2 may be disposed in the same layer as the source lines SL. The third top wiring lines TM3 may be disposed in a layer higher in the third direction than the source lines SL. Although FIG. 8 illustrates third top wiring lines TM3 disposed in a layer higher than the source lines SL, the third top wiring lines TM3 may be disposed in the same layer as the source lines SL.

Vertical vias V1, V2 and V3, which are coupled to the first, second and third top wiring lines TM1, TM2 and TM3, respectively, may be disposed in the first, second and third openings OFC1, OFC2 and OFC3, respectively. The vertical vias V1, V2 and V3 may include first vertical vias V1 that are coupled to the first top wiring lines TM1, second vertical vias V2 that are coupled to the second top wiring lines TM2, and third vertical vias V3 that are coupled to the third top wiring lines TM3.

Over the first opening OFC1, top ends of the first vertical vias V1 may be coupled to the first top wiring lines TM1, respectively. Under the first opening OFC1, bottom ends of the first vertical vias V1 may be coupled to the logic structure P. Over the second opening OFC2, top ends of the second vertical vias V2 may be coupled to the second top wiring lines TM2, respectively. Under the second opening OFC2, bottom ends of the second vertical vias V2 may be coupled to the logic structure P. Over the third opening OFC3, top ends of the third vertical vias V3 may be coupled to the third top wiring lines TM3, respectively. Under the third opening OFC3, bottom ends of the third vertical vias V3 may be coupled to the logic structure P.

Referring to FIGS. 8 and 10, ends of under wiring lines UM1, UM2 and UM3 may be coupled to the source regions S of pass transistors PTR1, PTR2 and PTR3 through the second contacts C2, respectively. The ends of under wiring lines UM1, may extend to the bottom of the first opening OFC1. The ends of the under wiring lines UM2 may extend to the bottom of the second opening OFC2, and the ends of the under wiring lines UM3 may extend to the bottom of the third opening OFC3. The first to third vertical vias V1, V2 and V3 may be coupled to the other ends of the under wiring lines UM1, UM2 and UM3, respectively. The under wiring lines UM1, UM2 and UM3 may include first under wiring lines UM1 that are coupled to the first vertical vias V1, second under wiring lines UM2 that are coupled to the second vertical vias V2, and third under wiring lines UM3 that are coupled to the third vertical vias V3.

The pass transistors PTR1, PTR2 and PTR3 may include first pass transistors PTR1, which are coupled to the first under wiring lines UM1; second pass transistors PTR2, which are coupled to the second under wiring lines UM2; and third pass transistors PTR3, which are coupled to the third under wiring lines UM3. The first pass transistors PTR1 may be disposed closer to the peripheral region PR in the first direction than the second pass transistors PTR2. The second pass transistors PTR2 may be disposed closer to the peripheral region PR in the first direction than the third pass transistors PTR3.

The first under wiring lines UM1 may be disposed closer to the peripheral region PR in the first direction than the second under wiring lines UM2. The second under wiring lines UM2 may be disposed closer to the peripheral region PR in the first direction than the third under wiring lines UM3. An area in which the first under wiring lines UM1 are disposed, an area in which the second under wiring lines UM2 are disposed, and an area in which the third under wiring lines UM3 are disposed may be disposed along the first direction FD. Therefore, it is possible to prevent the first to the third under wiring lines UM1 to UM3 from being disposed at a high density in a specific area, and bottleneck of the under wiring lines UM1 to UM3 can be prevented, suppressed or minimized.

In order to couple the pass transistor PTR3 farthest away from the peripheral region PR to the electrode layer 20, a longer wiring line must be used. If the length of the wiring line increases, a loading may increase. Therefore, because an operation voltage may largely drop in a process during which the operation voltage is transferred to the electrode layer 20 through the wiring line from the pass transistor PTR3, an operation voltage having a low level may be applied to the electrode layer 20.

Consequently, if the operation voltage having a low level is applied to the electrode layer 20, the reliability of the semiconductor memory device may degrade. For instance, if a low program voltage is applied to a word line in a program operation, a rise in the threshold voltage of a memory cell may decrease, resulting in a slow cell whose cell distribution characteristic is degraded. That is to say, a slow failure may be caused. Therefore, it is necessary to lower the loading of the wiring lines that couple the pass transistors PTR3 from the peripheral region PR and the electrode layer 20.

As described above, since a conductive material which forms the top wiring lines TM1, TM2 and TM3 has a resistivity lower than that of a conductive material which forms the under wiring lines UM1, UM2 and UM3, in order to lower the loading of the wiring line which couples the pass transistor PTR3 and the electrode layer 20 corresponding thereto, the length of the under wiring line UM3 used to couple the pass transistor PTR3 and the corresponding electrode layer 20 should be shortened.

By distributing the plurality of openings OFC2 and OFC3 in the cell region CR in the first direction FD, which is also the arrangement direction of the pass transistors PTR1 to PTR3, the distance between the pass transistor PTR3 and the opening OFC3 may be shortened. Accordingly, because the under wiring line UM3 which is used to couple the pass transistor PTR3 and the electrode layer 20 may be configured to have a short length for coupling the opening OFC3 and the pass transistor PTR3, it is possible to lower the loading of the wiring line UM3 and suppress an operation voltage from dropping due to the loading of the wiring line UM3, whereby the reliability of the semiconductor memory device may be improved.

Figure 11:
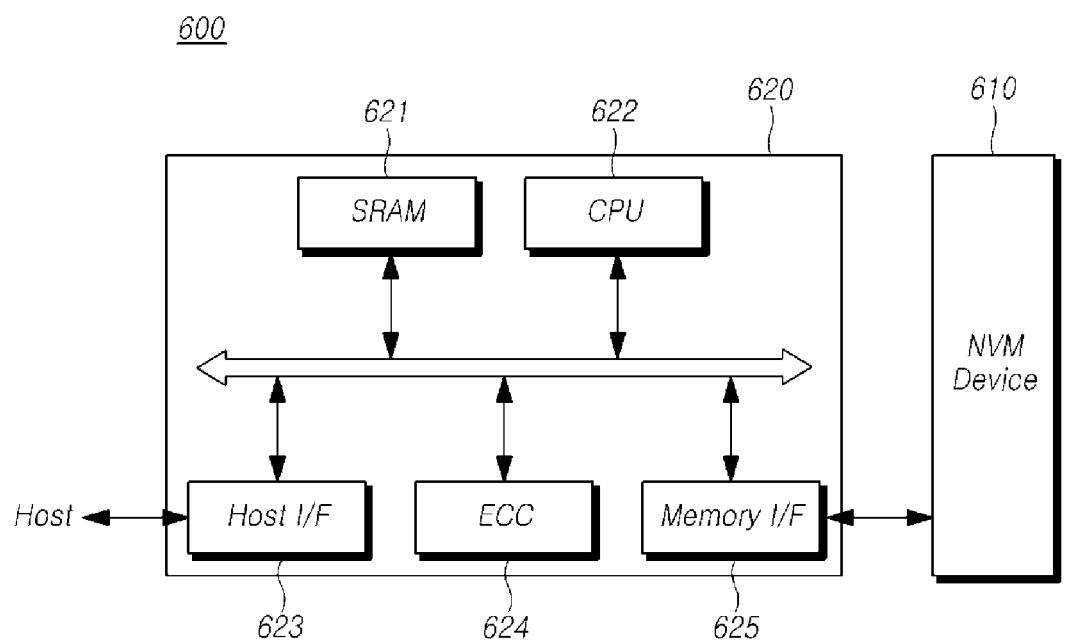
FIG. 11 is a diagram schematically illustrating a memory system including a semiconductor memory device in accordance with an embodiment of the disclosure.

FIG. 11 is a block diagram schematically illustrating an example of a memory system including a semiconductor memory device in accordance with an embodiment of the disclosure.

Referring to FIG. 11, a memory system 600 in accordance with an embodiment may include a nonvolatile memory device (NVM Device) 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit (CPU) 622. A host interface (HOST I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 12:
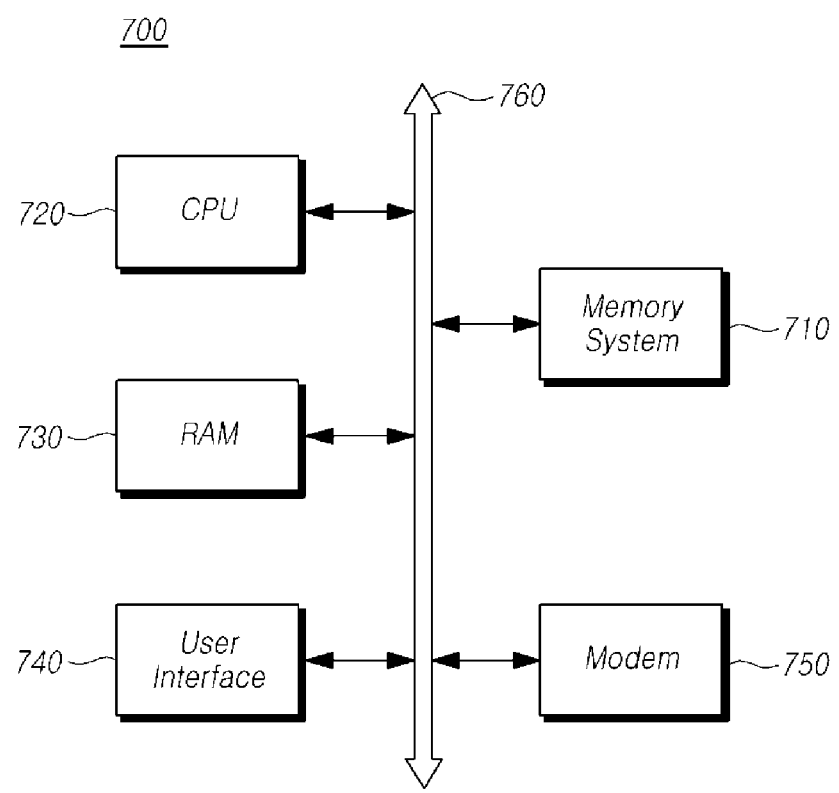
FIG. 12 is a block diagram schematically illustrating a computing system including a semiconductor memory device in accordance with an embodiment of the disclosure.

FIG. 12 is a block diagram schematically illustrating a computing system including a semiconductor memory device in accordance with an embodiment of the disclosure.

Referring to FIG. 12, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
   a cell region defined with a plurality of vertical channels which pass through a plurality of electrode layers and a plurality of interlayer dielectric layers alternately stacked on a source plate;
   a step region disposed adjacent to the cell region in a first direction parallel to a top surface of the source plate, and defined with a plurality of contacts which are coupled to the plurality of electrode layers extending in different lengths;
   a first opening passing through the plurality of electrode layers and the plurality of interlayer dielectric layers in a vertical direction in the step region;
   a second opening passing through the plurality of electrode layers and the plurality of interlayer dielectric layers in the vertical direction in the cell region;
   a plurality of under wiring lines disposed under the source plate, and coupled with a peripheral circuit which is defined on a substrate below the source plate;
   a plurality of top wiring lines disposed over the plurality of electrode layers and the plurality of interlayer dielectric layers and coupled with the plurality of contacts; and
   a plurality of vertical vias coupling the plurality of under wiring lines and the plurality of top wiring lines,
   wherein the plurality of vertical vias include a plurality of first vertical vias which pass through the first opening and a plurality of second vertical vias which pass through the second opening.

2. The semiconductor memory device according to claim 1,
   wherein the plurality of top wiring lines comprise:
   first top wiring lines coupled to the first vertical vias; and
   second top wiring lines coupled to the second vertical vias,
   wherein the first top wiring lines are disposed in the step region, and
   wherein one ends of the second top wiring lines are disposed in the step region, and the opposite ends of the second top wiring lines are disposed in the cell region.

3. The semiconductor memory device according to claim 2, wherein a plurality of contacts that are coupled to the second top wiring lines are disposed closer to the cell region than a plurality of contacts that are coupled to the first top wiring lines.

4. The semiconductor memory device according to claim 2, further comprising:
a plurality of bit lines disposed over the plurality of electrode layers in the cell region,
wherein the first top wiring lines are disposed in the same layer as the plurality of bit lines.

5. The semiconductor memory device according to claim 2, further comprising:
a plurality of bit lines disposed over the plurality of electrode layers in the cell region,
wherein the second top wiring lines are disposed in a layer higher than the plurality of bit lines.

6. The semiconductor memory device according to claim 5, further comprising:
source lines disposed in a layer higher than the plurality of bit lines in the cell region,
wherein the second top wiring lines are disposed in the same layer as the source lines.

7. The semiconductor memory device according to claim 1,
wherein the peripheral circuit includes a plurality of pass transistors, and
wherein the pass transistors are disposed in the step region and the cell region.

8. The semiconductor memory device according to claim 7,
wherein the plurality of under wiring lines comprise:
first under wiring lines coupled to the plurality of first vertical vias; and
second under wiring lines coupled to the plurality of second vertical vias,
wherein the semiconductor memory device further comprises:
a peripheral region disposed adjacent to the step region in the first direction opposite from the cell region, and
wherein the plurality of pass transistors which are coupled to the first under wiring lines are closer to the peripheral region than the plurality of pass transistors which are coupled to the second under wiring lines.

9. The semiconductor memory device according to claim 1, wherein the plurality of top wiring lines are formed of a material which has a resistivity lower than that of the plurality of under wiring lines.

10. The semiconductor memory device according to claim 1,
wherein, in the cell region, the plurality of electrode layers includes at least one source select line, a plurality of word lines and at least one drain select line which are sequentially stacked, and
wherein the second opening passes through the source select line, the plurality of word lines and the drain select line of the cell region.

11. A semiconductor memory device comprising:
a cell region having a plurality of vertical channels which pass through a plurality of electrode layers and a plurality of interlayer dielectric layers alternately stacked on a source plate;
a step region adjacent to the cell region in a first direction that is parallel to a top surface of the source plate, and having a plurality of contacts which are coupled to the plurality of electrode layers extending in different lengths into the step region;
a first opening passing through the plurality of electrode layers and the plurality of interlayer dielectric layers in a vertical direction in the step region;
a second opening and a third opening passing through the plurality of electrode layers and the plurality of interlayer dielectric layers in the vertical direction in the cell region, and arranged in the first direction;
a plurality of under wiring lines disposed under the source plate, and coupled with a peripheral circuit which is defined on a substrate below the source plate;
a plurality of top wiring lines disposed over the plurality of electrode layers and the plurality of interlayer dielectric layers and coupled with the plurality of contacts; and
a plurality of vertical vias coupling the plurality of under wiring lines and the plurality of top wiring lines,
wherein the plurality of vertical vias include a plurality of first vertical vias which pass through the first opening, a plurality of second vertical vias which pass through the second opening, and a plurality of third vertical vias which pass through the third opening.

12. The semiconductor memory device according to claim 11,
wherein the plurality of top wiring lines comprise:
first top wiring lines coupled to the plurality of first vertical vias;
second top wiring lines coupled to the plurality of second vertical vias; and
third top wiring lines coupled to the plurality of third vertical vias,
wherein the plurality of first top wiring lines are disposed in the step region, and
wherein one ends of the second and third top wiring lines are disposed in the step region, and the opposite ends of the second and third top wiring lines are disposed in the cell region.

13. The semiconductor memory device according to claim 12, wherein a plurality of contacts that are coupled to the second top wiring lines are disposed closer to the cell region than a plurality of contacts that are coupled to the first top wiring lines, and a plurality of contacts that are coupled to the third top wiring lines are disposed closer to the cell region than a plurality of contacts coupled to the second top wiring lines.

14. The semiconductor memory device according to claim 12, further comprising:
a plurality of bit lines disposed over the plurality of electrode layers in the cell region,
wherein the first top wiring lines are disposed in the same layer as the plurality of bit lines.

15. The semiconductor memory device according to claim 12, further comprising:
a plurality of bit lines disposed over the plurality of electrode layers in the cell region,
wherein the second and third top wiring lines are disposed in a layer higher than the plurality of bit lines.

16. The semiconductor memory device according to claim 15, further comprising:
source lines disposed in a layer higher than the plurality of bit lines in the cell region,
wherein the second and third top wiring lines are disposed in the same layer as the source lines.

17. The semiconductor memory device according to claim 11,
wherein the peripheral circuit includes a plurality of pass transistors, and wherein the plurality of pass transistors are disposed in the step region and the cell region.

18. The semiconductor memory device according to claim 17, further comprising:
a peripheral region adjacent to the step region and disposed in the first direction opposite to the cell region,
wherein the plurality of under wiring lines comprise:
first under wiring lines coupled to the plurality of first vertical vias;
second under wiring lines coupled to the plurality of second vertical vias; and
third under wiring lines coupled to the plurality of third vertical vias, and
wherein the plurality of pass transistors that are coupled to the first under wiring lines are closer to the peripheral region than pass transistors that are coupled to the second under wiring lines, and the pass transistors that are coupled to the second under wiring lines are closer to the peripheral region than pass transistors that are coupled to the third under wiring lines.

19. The semiconductor memory device according to claim 11, wherein the plurality of top wiring lines are formed of a material which has a resistivity lower than that of the plurality of under wiring lines.

20. A semiconductor memory device comprising:
a plurality of pass transistors defined in a substrate which is defined with a cell region, a step region extending in a first direction from the cell region and a peripheral region extending in the first direction from the step region;
a plurality of electrode layers and a plurality of interlayer dielectric layers alternately stacked on a source plate over the plurality of pass transistors;
vertical channels passing through the plurality of electrode layers and the plurality of interlayer dielectric layers in the cell region;
a plurality of under wiring lines disposed between the plurality of pass transistors and the source plate, and coupled to the plurality of pass transistors;
a plurality of top wiring lines disposed over the plurality of electrode layers and the plurality of interlayer dielectric layers, and coupled to the plurality of electrodes layers through a plurality of contacts that are coupled to the plurality of electrode layers, respectively, in the step region; and
a plurality of vertical vias coupling the plurality of top wiring lines and the plurality of under wiring lines,
wherein the plurality of vertical vias include first vertical vias that pass through a first opening defined in the plurality of electrode layers and the plurality of interlayer dielectric layers in the step region, and second vertical vias that pass through a second opening defined in the plurality of electrode layers and the plurality of interlayer dielectric layers in the cell region.

* * * * *